United States Patent [19]

So et al.

[11] Patent Number: 5,896,027
[45] Date of Patent: Apr. 20, 1999

[54] CURRENT RATIO DEVICE FOR USE IN FORMING A CURRENT TRANSFORMER

[75] Inventors: Eddy So, Gloucester; David A. Bennett, Smiths Falls, both of Canada

[73] Assignee: National Research Council of Canada, Ottawa, Canada

[21] Appl. No.: 08/824,490

[22] Filed: Mar. 27, 1997

[51] Int. Cl.$^6$ ........................................ H01F 40/06
[52] U.S. Cl. ........................... 323/357; 336/176
[58] Field of Search ........................ 323/355, 356, 323/357, 358; 324/117 R, 124; 336/175, 176

[56] References Cited

U.S. PATENT DOCUMENTS

| | | | |
|---|---|---|---|
| 3,534,247 | 10/1970 | Miljanic | 323/357 |
| 3,848,178 | 11/1974 | Marks | 323/357 |
| 5,150,270 | 9/1992 | Ernst et al. | 361/64 |
| 5,307,008 | 4/1994 | So | 323/357 |

OTHER PUBLICATIONS

Miljanic, P. et al., "An Electronically Enhanced Magnetic Core for Current Transformers", published in IEEE Trans. Instrum. Meas., No. 40, No. 2, pp. 410–414, Apr. 1991.

So, E. et al., "High–Current High–Precision Openable–Core AC and AC/DC Current Transformers", IEEE Trans. Instrum. Meas., vol. 42, No. 2, pp. 571–576, Apr. 1993.

Ramboz, J.D., "A Highly Accurate Hand–Held Clamp–On Current Transformer", IEEE Trans. Instrum. Meas., vol. 45, No. 2, pp. 445–448, Apr. 1996.

Brooks, H.B. and Holtz, F.C., "The Two–Stage Current Transformer", AEEE Trans. 41.382 (1922).

Moore, W.J.M. and Miljanic, P.N., "The Current Comparator", Inst. Elec. Eng. Electrical Measurement Series, vol. 4, London, UK: Peter Peregrinus, 1988. (Book).

Primary Examiner—Adolf Berhane

[57] ABSTRACT

A current ratio device for use in forming a hand-held openable-core clamp-on type of current transformer. The device employs electronically-aided three-stage circuitry for forming a current transformer capable of accurate low current measurements over a wide range of operation. Such a current transformer is specifically adapted for use with highly accurate active/reactive power and energy meters, and harmonic power analysers. For example a preferred form of clamp-on transformer can be used to measure currents in the range from 1 A to 200 A with ratio errors of less than $50 \times 10^{-6}$ for both the in-phase and quadrature components.

14 Claims, 4 Drawing Sheets

CURRENT RATIO DEVICE FOR USE IN FORMING A CURRENT TRANSFORMER

FIELD OF THE INVENTION

This invention relates to a the field of current ratio devices for use in current transformers, and in a preferred form a clamp-on current transformer having ratio errors below $50 \times 10^{-6}$ for use in the measurement of electric power and energy.

BACKGROUND OF THE INVENTION AND PRIOR ART

A current transformer refers to a transformer used to deliver to electrical measuring and controlling devices a representation of the line current. Power and energy meters and harmonic power analyzers are currently available with accuracies in the range of approximately 0.01% and 0.1%. These accurate measuring instruments can be used for in situ calibration of power and energy measuring systems and on-site measurements of harmonics in distribution systems.

These measuring instruments require the use of a current transformer to transform the relatively high currents by a known ratio into lower current values that can be easily measured or applied to the measuring instruments.

Two forms of current transformer are currently available. The first is a reference current transformer where the current carrying circuit must be opened in order to insert the transformer into the circuit. This is often inconvenient and in many cases impossible given the location of the circuit to be tested. This problem has been addressed by a second type of current transformer, namely a hand-held clamp-on current transformer incorporating passive two-stage circuitry. Passive two-stage (two cores) transformers will be discussed in more detail below in conjunction with the drawings. However, traditional clamp-on current transformers have large errors in the order of several percent for both in-phase and quadrature components because the interruption of the magnetic core increases the reluctance of the core. These high error margins render traditional clamp-on current transformers unsuitable for use in conjunction with the highly accurate measuring instruments discussed above. Various attempts have been made to improve the accuracy of current transformers. For example, Miljanic, P. el al. in an article "An electronically enhanced magnetic core for current transformers", published in IEEE Trans. Instrum. Meas., Vol. 40, No. 2, pp. 410–414, April 1991 have described an electronically-aided two-stage technique that provides the magnetizing current from an electronic circuit and hence greatly increases the apparent permeability of the magnetic core of a current transformer, without a galvanic connection to either of the primary or secondary circuits.

The Miljanic electronically-aided two-stage technique has been successfully applied to an accurate 5000 A/5 A openable-core current transformer; and a 1000 A/5 A hand-held clamp-on current transformer as described in So, E. et al., "fligh-current high-precision openable-core ac and ac/dc current transformers", IEEE Trans. Instrum. Meas., Vol. 42, No. 2, pp. 571–576, April 1993; and Ramboz, J. D. "A highly accurate hand-held clamp-on current transformer", IEEE Trans. Instrum. Meas., Vol. 45, No. 2, pp. 445–448, April 1996, respectively.

In the case of an openable core transformer, the primary limitation of both the passive two-stage arrangement and the electronically-aided two-stage arrangement is its operating linearity. Specifically with small magnetic cores (desirable for a small, light weight clamp-on transformer), it is difficult to achieve a wide dynamic range of operation between 0.5% and 100% of rated current with errors of less than $500 \times 10^{-6}$ for both the in-phase and quadrature components.

For example, as reported in the Ramboz article when a 1000 A/5 A clamp-on current transformer operates over a current range from 1% to 100% of rated current (i.e. 2 A to 200 A for a 200 A service) errors of less than $500 \times 10^{-6}$ for the in-phase component and less than $1000 \times 10^{-6}$ for the quadrature component are obtained. However, when operated at currents between 0.5%–1% of rated current (i.e. 1 A to 2 A for a 200 A service), the errors increase to approximately $1000 \times 10^{-6}$ for the in-phase component and approximately $3000 \times 10^{-6}$ for the quadrature component. These errors are unacceptable when highly accurate measurements are required such as in the calibration of electric power meters.

Consequently, there is a need for a current ratio device for use in forming a current transformer capable of (a) improving the linearity problem of prior art openable core devices, (b) using small magnetic cores and (c) reducing the overall error by preferably at least an order of magnitude. For example, it would be desirable to be able to produce a small size clamp-on current transformer capable of being operated over a current range of between 0.5% and 100% of rated current (i.e. 1 A to 200 A) with ratio errors of less than $50 \times 10^{-6}$ for both the in-phase component and for the quadrature component.

SUMMARY OF THE INVENTION

An object of the present invention is to provide a current ratio device for use in forming a current transformer, that improves the linearity of errors through a current range of between 0.5% and 100% of rated current.

An object of a preferred embodiment of the present invention is to provide a current ratio device for use in forming a current transformer that uses small magnetic cores suitable for use in hand-held clamp-on type transformers capable of operating in a current range of between 0.5% and 100% of rated current with ratio errors of generally less than $50 \times 10^{-6}$ for both the in-phase component and for the quadrature component.

In accordance with one aspect of the present invention there is provided a current ratio device for use in constructing a current transformer, said device comprising: a first magnetic core, a second magnetic core, a third magnetic core, a first measuring winding electromagnletically coupled with the second core and the third core but not with the first core, a second measuring winding electromagnetically coupled with the third core but not with the first and second cores, at least one amplifier having an input and an output, the input of a said amplifier being connected to receive an alternating waveform appearing across the first measuring winding, the input of a said amplifier being connected to receive an alternating waveform appearing across the second measuring winding, outer winding means electromagnetically coupled with the first, second and third cores, said outer winding means including a secondary winding for connection across a measuring burden, and the output of a said amplifier being connected to said outer winding means to provide a magnetizing current required to magnetize the first core when a primary winding is electromagnetically coupled with the first, second and third cores and an alternating current flows in said primary winding.

DETAILED DESCRIPTION OF THE DRAWINGS

Embodiments of the present invention will be described therein below in conjunction with the following drawings in which.

DETAILED DESCRIPTION OF THE PRIOR ART
Passive Two-Stage

Figure 1:
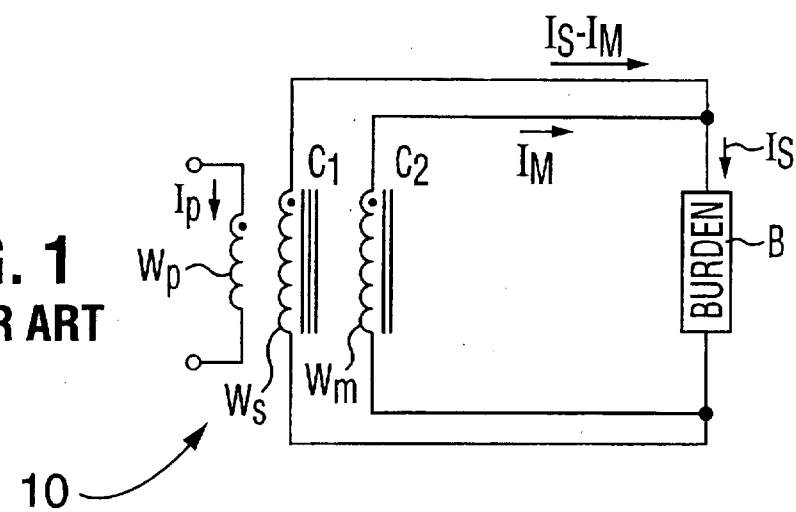
FIG. 1 is a prior art passive two-stage circuit for use in a current transformer.

The prior art circuit of FIG. 1 shows a passive two-stage current transformer 10 with two cores $C_1$ and $C_2$. The operation of circuit 10 is described in detail in Brooks, H. B. and Holtz, F. C., "The two-stage Current Transformer," AIEE Trans. 41. 382 (1922), which is incorporated herein by reference.

In general, the core $C_1$ couples electromagnetically with two windings that are outside it, namely a primary winding $W_p$, and a secondary winding $W_s$, but does not couple electromagnetically with a third, sensing or measuring winding $W_m$ that is wound on the core $C_2$. The core $C_2$ couples electromagnetically with all three windings ($W_p$, $W_s$, $W_m$). In the normal manner of a current transformer, an input or primary current $I_p$ flows in the primary winding $W_p$, and an output or secondary current $I_s$ flows in the secondary winding $W_s$ and a burden B (usually a very low impedance, current measuring instrument). This is only a theoretical result, since in practice the current through the burden B is the secondary current $I_s$ minus the an magnetizing current (an error current) $I_m$. It is this factor that introduces errors into the current transformer, that must be compensated for.

In other words since a component of the primary current $I_p$ is required to magnetize the core $C_1$, the secondary current $I_s$ is deficient by a corresponding amount, and the theoretical equality of ampere turns between the primary and secondary circuits contains an error, such error being expressed as the magnetizing current $I_M$. The flux in the core $C_1$ corresponding to this magnetizing current is sensed by the measuring winding $W_m$ that acts with core $C_2$ to generate the Current $I_M$ in the winding $W_m$ that is equal to the magnetizing current.

Electronically-aided Two-Stage

Figure 2:
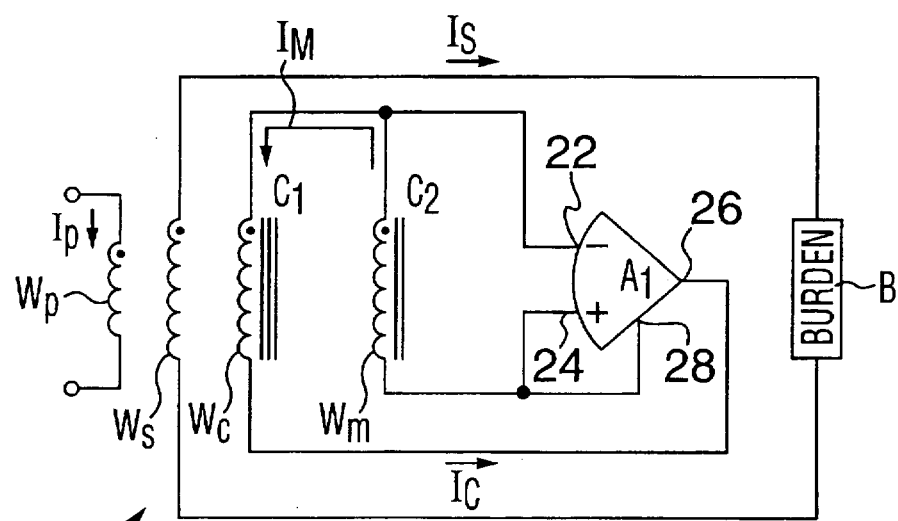
FIG. 2 is a prior art electronically-aided two-stage circuit for use in a current transformer.

The prior art circuit of FIG. 2 shows an electronically-aided two-stage current transformer 20 with two cores $C_1$ and $C_2$. The operation of circuit 20 is described in detail in U.S. Pat. No. 5,307,008 issued Apr. 26, 1994 to E. So, which is incorporated herein by reference. The circuit 20 has been successfully applied to high-current 5000 A/5 A openable-core and 1000 A/5 A hand-held clamp-on current transformers as described in the above literature references to So and Ramboz.

The core $C_1$ couples electromagnetically with three windings that are outside it, namely a primary winding $W_p$, a secondary winding $W_s$, and a compensating or correction winding $W_c$, but does not couple electromagnetically with a fourth, sensing or measuring winding $W_m$ that is wound on the core $C_2$. The core $C_2$ couples electromagnetically with all four windings ($W_p$, $W_s$, $W_c$, $W_m$). The primary current $I_p$ flows in the primary winding $W_p$, and the secondary current $I_s$ flows in the secondary winding $W_s$ and the burden B.

Since a component of the primary current $I_p$ is required to magnetize the core $C_1$, the secondary current $I_s$ is deficient by a corresponding amount, and the theoretical equality of ampere turns between the primary and secondary circuits contains an error, such error being expressed as the magnetizing current. The flux in the core $C_1$ corresponding to this magnetizing current is sensed by the measuring winding $W_m$ that acts with core $C_2$ to generate a current $I_M$ in the winding $W_m$ that is equal to the magnetizing current.

An amplifier $A_1$ (which essentially distinguishes circuit 20 from the passive circuit 10) is used to reduce the burden on the core $C_2$ so that the current in the measuring winding $W_m$ is an accurate measure of the current that magnetises the core $C_1$. The ends of the winding $W_m$ are connected to input terminals 22 and 24 of the amplifier $A_1$ so that such input receives the current in this measuring winding $W_m$. The amplifier $A_1$ has an external power supply (not shown) and a gain that is such that no appreciable voltage is permitted to remain across the terminals 22 and 24.

A pair of output terminals 26 and 28 of the amplifier $A_1$ form a series circuit through windings $W_m$ and $W_c$ so that current $I_M$ passing through winding $W_m$ is equal to the current $I_c$ passing through winding $W_c$. Therefore, in this case, the compensating current $I_c$ equals the measuring current $I_M$ and becomes equal to the magnetizing current, thus supplying the necessary magnetizing current for the core $C_1$. This arrangement eliminates the need for this magnetizing current to be supplied from the primary current $I_p$. As a result, the true equality of the ampere turns in the primary and secondary windings is not upset by the need to supply a magnetizing current.

An induced voltage is still necessary to cancel the internal burden or leakage impedance of the measuring winding $W_m$. In order for the core $C_2$ to be properly demagnetized (i.e. to reduce magnetic flux to a very small value) the induced voltage must be very small.

To generate a small induced voltage the core $C_2$ must be made of core material having high permeability with a sufficiently large cross section and a short magnetic path length or low reluctance. Also, the internal burden or leakage impedance of measuring winding $W_m$ must be made as small as possible. However, these requirements contraindicate the inherent properties of a hand-held clamp-on current transformer (e.g. physically small size and light weight). In particular, the limitations imposed on the size of the magnetic cores, the size of the copper wires and the number of turns of the windings, make it difficult for the measuring winding $W_m$ to have a small internal burden or leakage impedance.

An additional problem is introduced by the openable split-core feature of a clamp-on current transformer, which increases the reluctance of the magnetic path or reduces the effective permeability of the cores.

In summary, for a small clamp-on current transformer, it is difficult to have the magnetic flux in core $C_2$ reduced to a very small value. This in turn imposes a limit on the effectiveness of the electronically-aided two-stage circuit 20 in reducing the overall ratio errors of a hand-held clamp-on current transformer. As described in the Ramboz reference, it is difficult to achieve a wide dynamic range of operation between 0.5% and 100% of rated current with errors of much less than $500 \times 10^{-6}$ for both in-phase and quadrature components.

DETAILED DESCRIPTION OF PREFERRED EMBODIMENTS OF THE PRESENT INVENTION

Figure 3A:
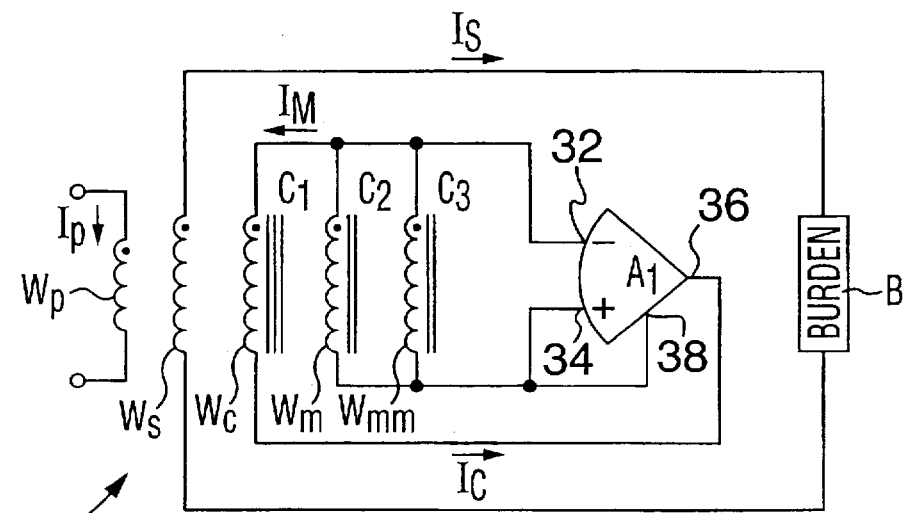
FIG. 3A is an electronically-aided three-stage circuit for use in a current transformer according to an embodiment of the present invention.

FIG. 3A illustrates an electronically-aided three-stage current ratio device 30 for use in forming a current transformer, that is an embodiment of the present invention. The current ratio devices discussed below will be referred to as current transformer circuits for simplicity and consistency in terminology. The cores $C_1$ and $C_2$ and the windings $W_p$, $W_s$, $W_c$, $W_m$ operate in the same manner as described in conjunction with the circuit 20 of FIG. 2. The circuit 30 introduces a core $C_3$ and a second measuring winding $W_{mm}$ as a third stage to the two-stage circuit 20 of FIG. 2. The windings $W_m$ and $W_{mm}$ have the same number of turns as each other in the embodiment shown in FIG. 3A.

As discussed in conjunction with FIG. 2 the goal of circuit 30 is to reduce the magnetic flux in core $C_2$ to a very small value, which requires the measuring winding $W_m$ to have a small internal burden or leakage impedance. The introduction of a third stage to the circuit 20 to form circuit 30 functions to further reduce the magnetic flux of the core $C_2$, which is proportional to its magnetizing current, thereby increasing its effective permeability.

The core $C_1$ couples electromagnetically with three windings that are outside it, namely the primary winding $W_p$, the secondary winding $W_s$ and the correction winding $W_c$, but does not couple electromagnetically with the two measuring windings $W_m$, $W_{mm}$ that are wound on the cores $C_2$ and $C_3$, respectively. The core $C_2$ couples electromagnetically with four windings ($W_p$, $W_s$, $W_c$, $W_m$), and the core $C_3$ couples electromagnetically with all five windings ($W_p$, $W_s$, $W_c$, $W_m$, $W_{mm}$). The input or primary current $I_p$ flows in the primary winding $W_p$, and the secondary current $I_s$ flows in the secondary winding $W_s$ and the burden B.

The amplifier $A_1$ is used to reduce the burden on the core $C_2$ so that the current in the second measuring winding $W_{mm}$ is an accurate measure of the current that magnetises the core $C_1$. The ends of the winding $W_{mm}$ are connected to input terminals 32 and 34 of the amplifier $A_1$ so that such input receives the current in this winding $W_{mm}$. The amplifier $A_1$ has an external power supply (not shown) and a gain that is such that no appreciable voltage is permitted to remain across the terminals 32 and 34.

A pair of output terminals 36 and 38 of the amplifier $A_1$ form a series circuit through windings $W_c$ and a parallel combination of windings $W_m$ and $W_{mm}$ so that current $I_M$ passing in one direction through winding $W_m$ and $W_{mm}$ is equal to the current $I_c$ passing through winding $W_c$. The magnetizing current of the core $C_2$ is further reduced by a factor of approximately $Z_{m3}/Z_{DD}$, where $Z_{m3}$ is the magnetizing impedance of core $C_3$ and $Z_{DD}$ is the leakage impedance of winding $W_{mm}$.

Figure 3B:
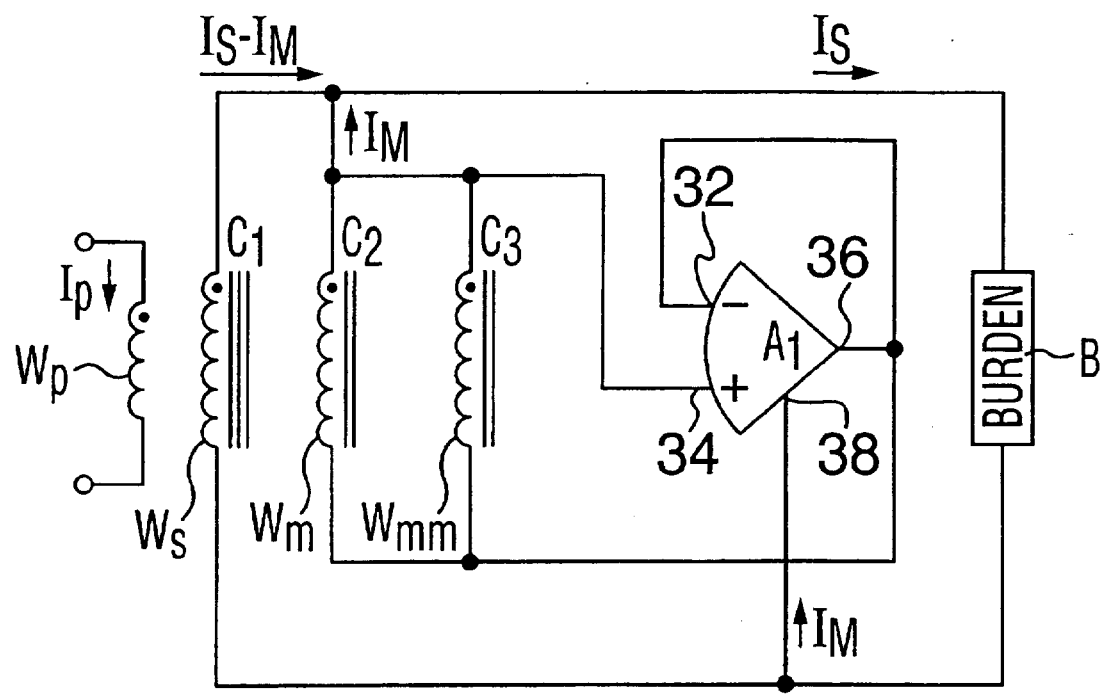
FIG. 3B is an alternative electronically-aided three-stage circuit for use in a current transformer according to another embodiment of the present invention.

FIG. 3B shows an alternative circuit 31 in which the compensating winding $W_c$ of FIG. 3A has been omitted. The function of the winding $W_c$ has been taken over by compensating means constituted by the combination of the secondary winding $W_s$ and both the measuring windings, since the outputs 36 and 38 of the amplifier A1 now passes a current $I_m$ equal to the magnetizing current through the two measuring windings in parallel and the secondary winding $W_s$.

Figure 4A:
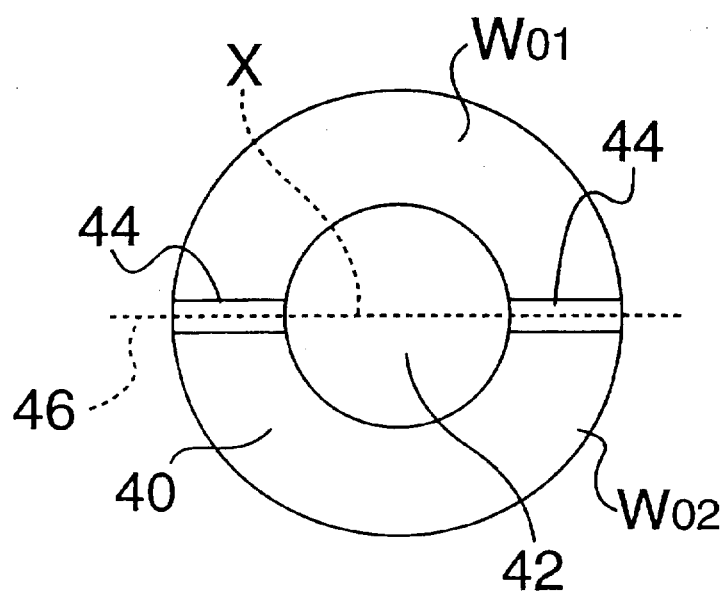
FIG. 4A is a small scale plan view of a toroidal assembly of cores and windings for implementing the circuit of FIG. 3, according to an embodiment of a structural aspect of the present invention.
Figure 4B:
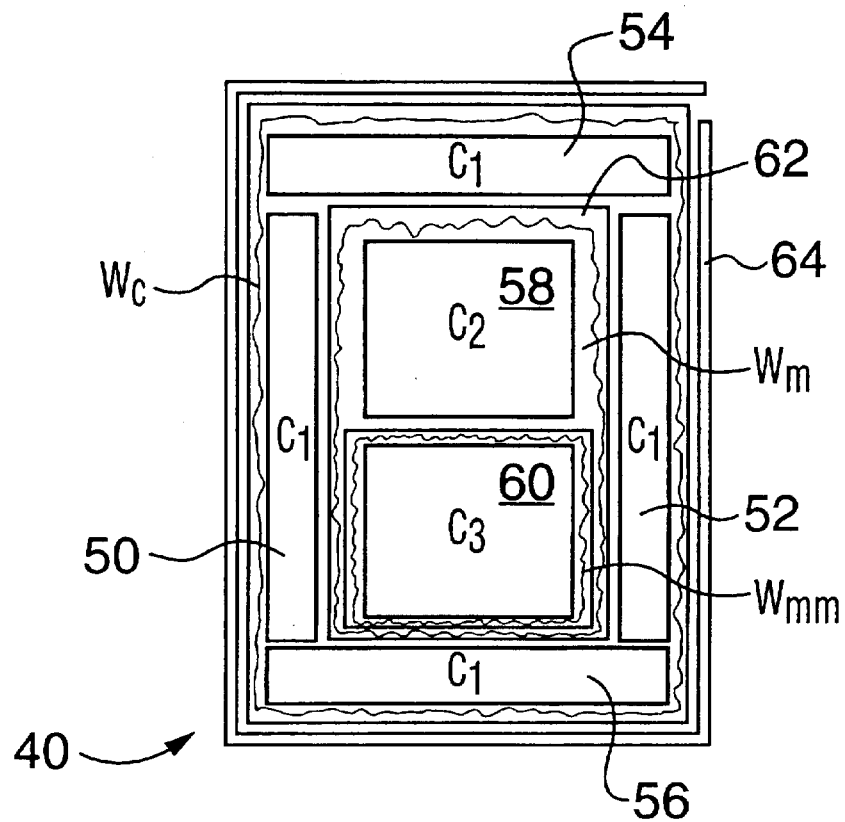
FIG. 4B is a cross-section of the toroidal assembly of FIG. 4A according to an embodiment of the invention.
Figure 4C:
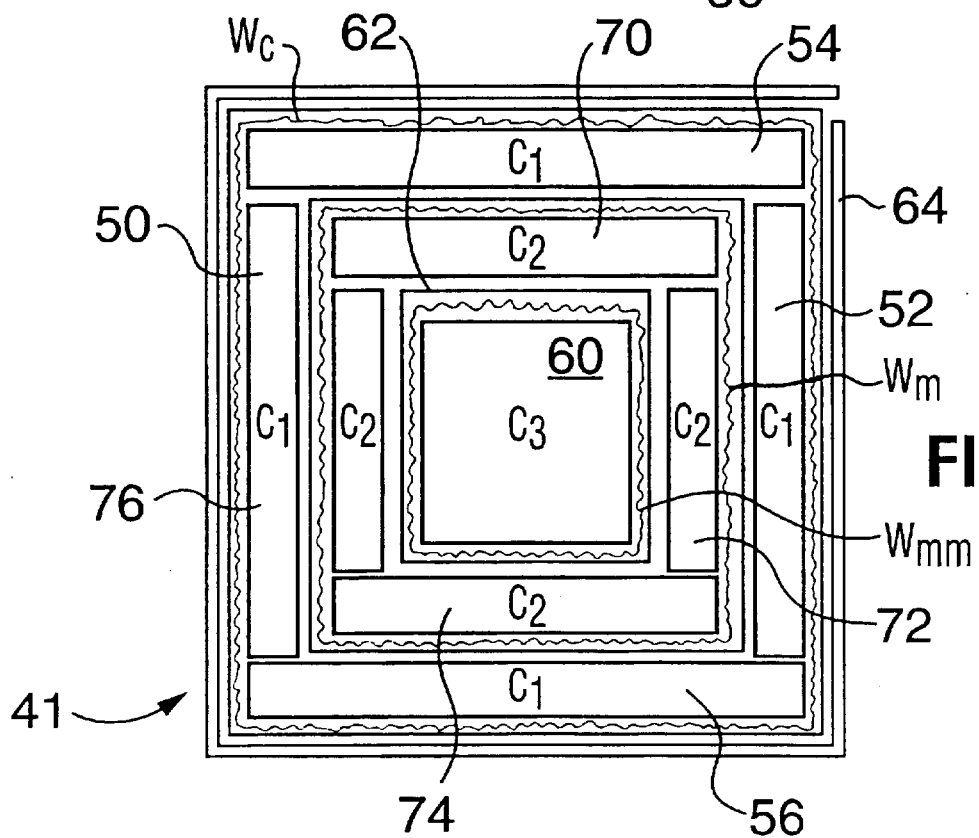
FIG. 4C is a cross-section of the toroidal assembly according to another embodiment of the invention.

FIGS. 4A–4C show preferred structural arrangements of cores and windings for the circuit 30 of FIG. 3A. FIG. 4A shows a toroidal core and winding assembly 40 defining a central hole 42 suitable for receiving a single turn primary (not shown), such as a busbar, or alternatively for the passage of convolutions of a multiple turns primary winding there through. Outside the core $C_1$ there is an outer winding assembly $W_o$ consisting of various windings, namely the correction winding $W_c$ and the secondary winding $W_s$ when the FIG. 3A, 3B or 5 circuitry is used.

The outer winding assembly $W_o$ is wound as two separate halves $W_{o1}$ and $W_{o2}$. The inner windings $W_m$ and $W_{mm}$ are similarly each divided into two portions whereby between their ends to define a pair of diametrically opposite, unwound core sections 44. After a complete toroidal core and winding assembly 40 of this construction has been formed, it is cut through along a diametrical plane 33 that passes through the unwound sections 44 and contains the axis X of the toroidal assembly.

The toroidal assembly 40 consists of laminated core members that in cross-section (FIG. 4B) consist of two spaced apart side members 50 and 52 and top and bottom members 54 and 56 to complete a closed periphery. The members 50, 52, 54, and 56 combine to form an outer core that constitutes the core $C_1$ that completely encloses and shields a pair of inner members 58 and 60 that constitute the second and third cores $C_2$ and $C_3$, respectively.

The outer winding assembly $W_o$ (i.e. $W_c$ and $W_s$ in FIG. 3A or $W_s$ in FIG. 3B) is wound around core $C_1$. The first measuring winding $W_m$ is wound around cores $C_2$ and $C_3$ and the second measuring winding $W_{mm}$ is wound around core $C_3$. A copper shield 64 surrounds the entire assembly 40. A space between the cores and windings is filled with the usual insulation and epoxy that fill all parts of the space 62 that would otherwise be void.

FIG. 4C illustrates an alternative embodiment (assembly 41) of the core structure in which both the outer first core $C_1$ (having members 50, 52, 54, and 56) and an intermediate second core $C_2$ (having members 70, 72, 74, and 76) are divided into four components that enclose and shield the third inner core $C_3$ that consists of member 60. The outer winding assembly $W_o$ (i.e. $W_c$ and $W_s$ in FIG. 3A or $W_s$ in FIG. 31B) is wound around core $C_1$. The first measuring winding $W_m$ is wound around core $C_2$ and the second measuring winding $W_{mm}$ is wound around core $C_3$. A copper shield 64 surrounds the entire assembly 40. A space between the cores and windings is filled with the usual insulation and epoxy that fill all parts of the space 62 that would otherwise be void.

Details of a toroid construction is well known in the art. An example of a toroid core is shown in U.S. Pat. No. 5,307,008.

Figure 5:
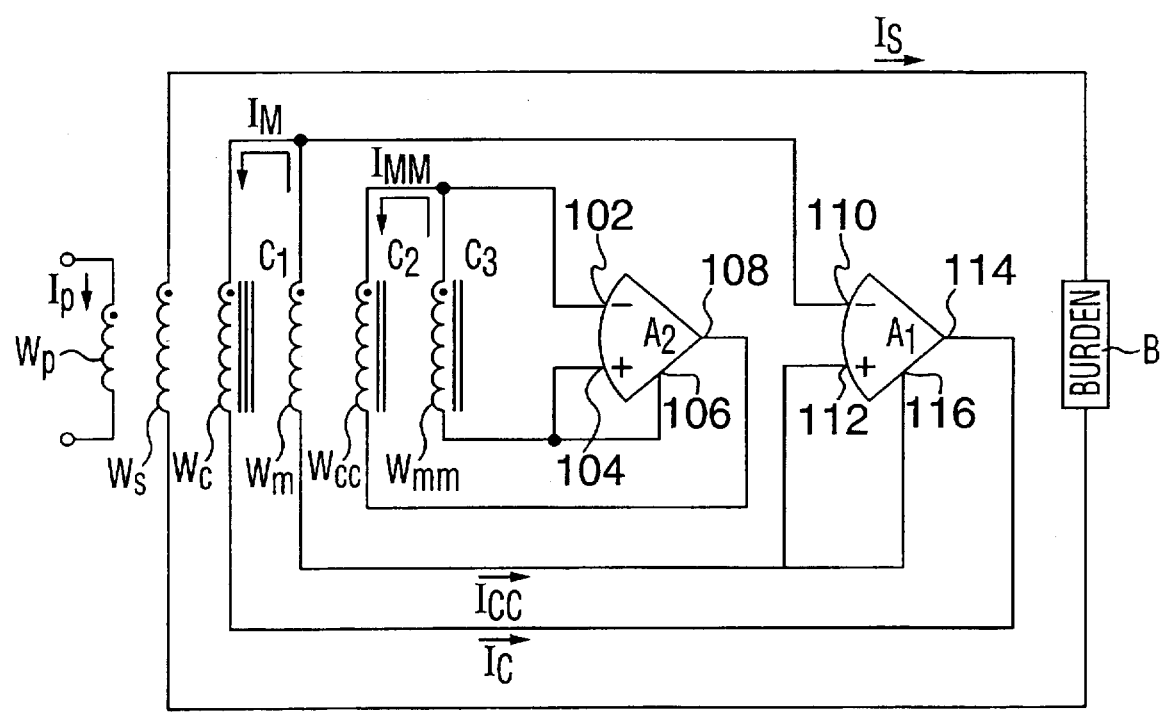
FIG. 5 is an electronically-aided three-stage circuit for use in a current transformer according to another embodiment of the present invention.

FIG. 5 illustrates an alternative embodiment of a three-stage electronically-aided current transformer circuit 100. The circuit 100 introduces a second correction winding $W_{cc}$ and a second amplifier $A_2$ to the circuit 30 of FIG. 3A. The windings $W_m$ and $W_{mm}$ have the same number of turns as each other in the embodiment shown in FIG. 5.

The core $C_1$ couples electromagnetically with three windings that are outside it, namely the primary winding $W_p$, the secondary winding $W_s$ and the correction winding $W_c$, but does not couple electromagnetically with the two measuring windings $W_m$, $W_{mm}$ and the second correction winding $W_{cc}$, where the second correction winding $W_{cc}$ is wound on core $C_2$ and the second measuring winding $W_{mm}$ is wound on core $C_3$. The core $C_2$ couples electromagnetically with five windings ($W_p$, $W_s$, $W_c$, $W_m$, $W_{cc}$), and the core $C_3$ Couples electromagnetically with all six windings ($W_p$, $W_s$, $W_c$, $W_m$, $W_{mm}$, $W_{cc}$). The input or primary current $I_p$ flows in the primary winding $W_p$, and the secondary current $I_s$ flows in the secondary winding $W_s$ and the burden B.

The amplifier $A_1$ is used to reduce the burden on the core $C_2$ so that the current in the measuring winding $W_m$ is an accurate measure of the current that magnetises the core $C_1$. The ends of the winding $W_m$ are connected to input terminals 110 and 112 of the amplifier $A_1$ so that such input receives the current in this measuring winding $W_m$. The amplifier $A_1$ has an external power supply (not shown) and a gain that is such that no appreciable voltage is permitted to remain across the terminals 110 and 112.

A pair of output terminals 114 and 116 of the amplifier $A_1$ form a series circuit through windings $W_m$ and $W_c$ so that current $I_M$ passing through winding $W_m$ is equal to the current $I_c$ passing through winding $W_c$. Therefore, in this case, the compensating current $I_c$ equals the measuring current $I_M$ and becomes equal to the magnetizing current, thus supplying the necessary magnetizing current for the cores $C_1$ and $C_2$.

The amplifier $A_2$ is used to reduce the burden on the core $C_3$ so that the current in the measuring winding $W_{mm}$ is an accurate measure of the current that magnetises the core $C_2$. The ends of the winding $W_{mm}$ are connected to input terminals 102 and 104 of the amplifier $A_2$ so that such input receives the current in this measuring winding $W_{mm}$. The amplifier $A_2$ has an external power supply (not shown) and a gain that is such that no appreciable voltage is permitted to remain across the terminals 102 and 104.

A pair of output terminals 106 and 108 of the amplifier $A_2$ form a series circuit through windings $W_{mm}$ and $W_{cc}$ so that current $I_{MM}$ passing through winding $W_{mm}$ is equal to the current $I_{cc}$ passing through winding $W_{cc}$. Therefore, in this case, the compensating current $I_{cc}$ equals the measuring current $I_{MM}$ and becomes equal to the magnetizing current, thus supplying the necessary magnetizing current for the core $C_3$.

The circuit 100 enhances the effective permeability of the core $C_2$, which in turn is used to greatly enhance the effective permeability of the core $C_1$. The overall result is further improvement in the linearity and the ratio accuracy of the openable-core clamp-on current transformer.

In the circuits 30, 31 and 100 it is necessary for the windings to having the same number of turns as each other. If it is preferred to avoid this requirement, which in some instances necessitates a larger number of turns than is convenient, a more general circuit can be used that incorporates resistors as shown in FIG. 5 of U.S. Pat. No. 5,307,008.

EXAMPLE

A current transformer embodying the circuit 30 was built into a clamp-on current transformer with a ratio of 200 A/1 A for testing and performance evaluation. The construction of the cores and windings are summarized in Tables 1 and 2, respectively.

TABLE 1

| CORE | SPECIFICATIONS |
|---|---|
| $C_1$ | - four 0.1 mm tape-wound supermalloy cores with an initial permeability greater than 40,000<br>(1) inner side 50: 19.1 mm × 34.3 mm × 39.4 mm<br>(2) outer side 52: 19.1 mm × 66 mm × 71.1 mm |

TABLE 1-continued

| CORE | SPECIFICATIONS |
|---|---|
|  | (3,4) upper and lower sides 54, 56: 6.4 mm × 34.3 mm × 71.1 mm<br>- pre-cut in two halves |
| $C_2$ | - one 0.1 mm tape-wound supermalloy core with an initial permeability greater than 40,000<br>(1) core 58: 6.4 mm × 45.7 mm × 61 mm<br>- precut in two halves |
| $C_3$ | - one 0.1 mm tape-wound supermalloy core with an initial permeability greater than 40,000<br>(1) core 60: 6.4 mm × 45.7 mm × 61 mm<br>- precut in two halves |

TABLE 2

| WINDING | SPECIFICATIONS |
|---|---|
| two measuring windings $W_m$, $W_{mm}$ | - each winding has a total of 150 turns (a pair of separate 75-turn half windings) |
| correction winding $W_C$ | - winding has a total of 150 turns (a pair of separate 75-turn half windings) |
| secondary winding $W_s$ | - winding has a total of 200 turns (a pair of separate 100-turn half windings) |
| primary winding $W_p$ | - a single-turn winding of the feed-through type |

As previously discussed, in conjunction with assembly 40 of FIG. 4B, the entire core assembly is enclosed in a copper box for mechanical protection and electrostatic shielding and filled with epoxy to prevent movements of various parts of the core assembly. The resulting measuring head has dimensions of 44.5 mm×22.9 mm×82.6 mm. The handle is made of insulating material with a strong spring action to ensure good surface contact between the two halves of the core assembly. Tests were performed to evaluate the errors and linearity of the current transformer with single-stage, two-stage, and three-stage operation at power frequencies.

Errors and Linearity

The errors and linearity of the transformer were measured at frequencies of 50 and 60 Hz, with burdens of 0.1 Ω and 1 Ω, and the core operating in the single-stage mode, two-stage mode (as circuit 20), and three-stage mode (as circuit 30) using a current-comparator-based current transformer test set. This test set is described in detail in Moore, W. J. M and Miljanic, P. N., "The current comparator", Inst. Elec. Eng. Electrical Measurement Series, Vol. 4, London, UK: Peter Peregrinus, 1988, which is incorporated herein by reference. Since the results at both frequencies are similar, only the results for 50 1Hz are shown in Table A and Table B.

Note that the results of the testing using a passive two-stage passive (as circuit 10) would be similar to the single-stage results listed in Tables A and B.

An error formula is defined as follows:

$$\alpha + j\beta = (nI_s - I_p)/I_p \qquad (1)$$

where α represents the in-phase error, β represents the quadrature error, and n is the transformer turns ratio.

One might expect the performance of the circuit 30 to be approximately the combination of the advantages of the single-stage and the electronically-aided two-stage (20). However, as the performance results of Tables A and B indicate the improvement by adding the third stage is a major performance enhancement over the both the single-stage and electronically-aided two-stage devices.

As summarized in Tables A and B, with the core operating in the three-stage mode and burdens of 0.1 Ω and 1 Ω, at currents between 0.5% and 100% of rated, the clamp-on current transformer is excellent with errors of less than $10\times10^{-6}$ for the in-phase component and less than $50\times10^{-6}$ for the quadrature component. This is a major improvement over the electronically-aided two-stage mode with a burden of 1 Ω, where errors are less than $250\times10^{-6}$ for the in-phase component and less than $100\times10^{-6}$ for the quadrature component.

The repeatability characteristic of the transformer was also evaluated by repeatedly opening and closing the clamp-on current transformer and measuring the errors again afterwards. The variations in the errors were consistent to better than $50\times10^{-6}$ for both the in-phase and quadrature components.

TABLE A

| Burden | 0.1 Ω | | | | | |
|---|---|---|---|---|---|---|
| Frequency | 50 Hz | | | | | |
| | Single-stage | | Two-stage (20) | | Three-stage (30) | |
| | α | β | α | β | α | β |
| 1 | −1030 | +j5280 | 123 | +j62 | −4 | +j25 |
| 0.5 | −800 | +j5590 | 122 | +j61 | −5 | +j24 |
| 0.1 | −600 | +j6250 | 150 | +j61 | −5 | +j28 |
| 0.05 | −440 | +j6680 | 154 | +j65 | −4 | +j29 |
| 0.01 | −240 | +j7170 | 166 | +j64 | −4 | +j31 |
| 0.005 | −180 | +j7270 | 176 | +j62 | −4 | +j31 |

To summarize the results of Table A:

(1) with a burden of 0.1 Ω, the electronically-aided two-stage mode compared to the single-stage mode provides an improvement in the accuracy of the hand-held clamp-on current transformer by a maximum of about 8 times (1030/123 at 1 A) for the in-phase component and by a maximum of about 117 times (7270/62 at 0.005 A) for the quadrature component;

(2) in contrast, with a burden of 0.1 Ω, the three-stage mode compared to the single-stage mode provides an improvement in the accuracy of the hand-held clamp-on current transformer by at least 45 times (180/4 at 0.005 A) and as high as 257 times (1030/4 at 1 A) for the in-phase component and at least 211 times (5280/25 at 1 A) and as high as 234 times (7270/31 at 0.005 A) as for the quadrature component, and (3) in addition, with a burden of 0.1 Ω, the three-stage mode compared to the electronically-aided two-stage mode provides further improvement in the accuracy of the hand-held clamp-on current transformer by at least 30 times (123/4 at 1 A) for the in-phase component and at least two times (62/31 at 0.005 A) for the quadrature component.

TABLE B

| Burden | 1 Ω | | | | | |
|---|---|---|---|---|---|---|
| Frequency | 50 Hz | | | | | |
| | Single-stage | | Two-stage (20) | | Three-stage (30) | |
| | α | β | α | β | α | β |
| 1 | −1500 | +j7050 | 176 | +j83 | −3 | +j37 |
| 0.5 | −1150 | +j7740 | 188 | +j80 | −4 | +j35 |
| 0.1 | −770 | +j8080 | 195 | +j79 | −4 | +j35 |
| 0.05 | −560 | +j8620 | 206 | +j79 | −4 | +j36 |
| 0.01 | −300 | +j9290 | 228 | +j84 | −2 | +j37 |
| 0.005 | −220 | +j9410 | 230 | +j82 | −2 | +j39 |

To summarize the results of Table B:

(1) with a burden of 1 Ω, the electronically-aided two-stage mode compared to the single-stage mode provides an improvement in the accuracy of the hand-held clamp-on current transformer by a maximum of about 8 times (1500/176 at 1 A) for the in-phase component and by a maximum of about 115 times (9410/82 at 0.005 A) for the quadrature component;

(2) in contrast, with a burden of 1 Ω, the three-stage mode compared to the single-stage mode provides an improvement in the accuracy of the hand-held clamp-on current transformer by at least 110 times (220/2 at 0.005 A) and as high as 500 times (1500/3 at 1 A) for the in-phase component and at least 190 times (7050/37 at 1 A) and as high as 241 times (9410/39 at 0.005 A) as for the quadrature component; and (3) in addition, with a burden of 1 Ω, the three-stage mode compared to the electronically-aided two-stage mode provides further improvement in the accuracy of the hand-held clamp-on current transformer by at least 59 times (176/3 at 1 A) for the in-phase component and at least two times (82/39 at 0.005 A) for the quadrature component.

We claim:

1. A current ratio device for use in constructing a current transformer, said device comprising:

(a) a first magnetic core, (b) a second magnetic core, (c) a third magnetic core, (d) a first measuring winding electromagnetically coupled with the second core and the third core but not with the first core, (e) a second measuring winding electromagnetically coupled with the third core but not with the first and second cores, (f) at least one amplifier having an input and an output, (g) the input of a said amplifier being connected to receive an alternating waveform appearing across the first measuring winding, (h) the input of a said amplifier being connected to receive an alternating waveform appearing across the second measuring winding, (i) outer winding means electromagnetically coupled with the first, second and third cores, said outer winding means including a secondary winding for connection across a measuring burden, and (j) the output of a said amplifier being connected to said outer winding means to provide a magnetizing current required to magnetize the first core when a primary winding is electromagnetically coupled with the first, second and third cores and an alternating current flows in said primary winding.

2. The device of claim 1, wherein there is only one amplifier, the input of which receives the waveforms from both the first and the second measuring windings and the output of which is connected to said outer winding means.

3. The device of claim 2, wherein the number of turns of the first and second measuring windings are equal to each other.

4. The device according to claim 2, wherein the outer winding means includes a correction winding, the output of the one amplifier being connected to the correction winding in series with a parallel connection of the first and second measuring windings to pass said magnetizing current therethrough.

5. The device according to claim 2, wherein the output of the one amplifier is connected to the secondary winding in series with a parallel connection of the first and second measuring windings to pass said magnetizing current therethrough.

6. The device of claim 1, wherein there are two amplifiers, the input of a first of said amplifiers receiving the waveform from the first measuring winding and the input of a second one of said amplifiers receiving the waveform from the second measuring winding.

7. The device of claim 6, wherein the number of turns of the first and second measuring windings are equal to each other.

8. The device according to claim 6, wherein the outer winding means includes a correction winding, the output of the first of said amplifiers being connected to said correction winding in series with the first measuring winding to pass said magnetizing current therethrough.

9. The device according to claim 8, including a further correction winding electromagnetically coupled with the second core and the third core but not with the first core, the output of the second of said amplifiers being corrected to said further correction winding in series with the second measuring winding to provide a magnetizing current for the third core.

10. The device according to claim 9, wherein the number of turns of the two correction windings are equal to each other.

11. The device according to claim 1, wherein said cores are combined into a toroidal core assembly and each of said windings is divided into a pair of separate portions, each such portion extending around the toroidal core assembly for a major part of a respective opposite half thereof to define between said portions a pair of diametrically opposite unwound core sections devoid of any windings.

12. The device according to claim 11, wherein the device is cut through both said unwound core sections along a plane containing the axis of the toroidal core assembly to form a pair of separate sub-assemblies that can be clamped together to reform the device.

13. The device according to claim 12, wherein said toroidal core assembly comprises,
 (i) a toroidal outer core having a cross-section comprising a closed peripheral portion to define a cavity surrounded by the outer core, said outer core forming said first core,
 (ii) one inner core in said cavity forming said second core,
 (iii) another inner core in said cavity spaced from said one inner core, the other inner core forming said third core, said second measuring winding being wound around said third core,
 (iv) said first measuring winding being wound around both said inner cores, and
 (v) said outer winding means extending around the outside of the peripheral portion of the outer core.

14. The device according to claim 12, wherein said toroidal core assembly comprises:
 (i) a toroidal magnetic outer core having a cross-section comprising a closed peripheral portion defining a cavity surrounded by the outer core, said outer core forming said first core,
 (ii) an toroidal intermediate core in said cavity having a cross-section comprising a closed peripheral portion defining an inner cavity surrounded by the intermediate core, said intermediate core forming said second core, and said first measuring winding being wound around said second core,
 (iii) an inner core in said inner cavity and forming said third core, said second measuring winding being wound around said third core, and
 (iv) said outer winding means extending around the outside of the peripheral portion of the outer core.

* * * * *